(12) United States Patent
Hutin et al.

(10) Patent No.: US 11,329,145 B2
(45) Date of Patent: May 10, 2022

(54) QUANTUM DEVICE WITH SPIN QUBITS COUPLED IN MODULATABLE MANNER (71) Applicant: COMMISSARIAT A L'ENERGIE ATOMIQUE ET AUX ENERGIES ALTERNATIVES, Paris (FR)

(72) Inventors: Louis Hutin, Saint-Martin-le-Vinoux (FR); Xavier Jehl, Noyarey (FR); Maud Vinet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 29 days.

(21) Appl. No.: 16/159,923

(22) Filed: Oct. 15, 2018

(65) Prior Publication Data
US 2019/0123183 A1 Apr. 25, 2019

(30) Foreign Application Priority Data
Oct. 18, 2017 (FR) ...................... 17 59789

(51) Int. Cl.
*H01L 29/66* (2006.01)
*H01L 29/06* (2006.01)
(Continued)

(52) U.S. Cl.
CPC ........ *H01L 29/66977* (2013.01); *B82Y 10/00* (2013.01); *H01L 21/266* (2013.01);
(Continued)

(58) Field of Classification Search
CPC ............. H01L 29/78648; H01L 21/266; H01L 21/2652; H01L 29/66977; H01L 27/1203
See application file for complete search history.

(56) References Cited

U.S. PATENT DOCUMENTS

2002/0179897 A1 12/2002 Eriksson et al.
2010/0270534 A1 10/2010 Pioro-Ladriere et al.
(Continued)

OTHER PUBLICATIONS

U.S. Appl. No. 15/967,778, filed May 1, 2018, Louis Hutin, et al.
(Continued)

*Primary Examiner* — Samuel A Gebremariam
*Assistant Examiner* — Jonas T Beardsley
(74) *Attorney, Agent, or Firm* — Oblon, McClelland, Maier & Neustadt, L.L.P.

(57) ABSTRACT

A quantum device with spin qubits, comprising:
a semiconductor portion arranged on a buried dielectric layer of a semiconductor-on-insulator substrate also including a semiconductor support layer, wherein first distinct parts each form a confinement region of one of the qubits and are spaced apart from one another by a second part forming a coupling region between the confinement regions of the qubits;
front gates each at least partially covering one of the first parts of the semiconductor portion;
and wherein the support layer comprises a doped region a part of which is arranged in line with the second part of the semiconductor portion and is self-aligned with respect to the front gates, and forms a back gate controlling the coupling between the confinement regions of the qubits.

14 Claims, 6 Drawing Sheets

(51) Int. Cl.
    H01L 29/423    (2006.01)
    B82Y 10/00     (2011.01)
    H01L 29/76     (2006.01)
    H01L 21/265    (2006.01)
    H01L 21/266    (2006.01)
    H01L 29/36     (2006.01)
    H01L 29/40     (2006.01)
    H01L 29/417    (2006.01)
    H01L 29/786    (2006.01)

(52) U.S. Cl.
    CPC ...... *H01L 21/2652* (2013.01); *H01L 29/0653* (2013.01); *H01L 29/0665* (2013.01); *H01L 29/36* (2013.01); *H01L 29/401* (2013.01); *H01L 29/41733* (2013.01); *H01L 29/41775* (2013.01); *H01L 29/42312* (2013.01); *H01L 29/42356* (2013.01); *H01L 29/66484* (2013.01); *H01L 29/66984* (2013.01); *H01L 29/7613* (2013.01); *H01L 29/78648* (2013.01); *H01L 29/78696* (2013.01)

(56)            References Cited

U.S. PATENT DOCUMENTS

2013/0020644 A1*  1/2013  Horita ................. H01L 21/2652
                                                        257/351
2013/0099315 A1*  4/2013  Zhu ................... H01L 29/78648
                                                        257/347
2015/0279981 A1   10/2015  Eriksson et al.
2019/0266511 A1*  8/2019  Pillarisetty ........ H01L 29/66977

OTHER PUBLICATIONS

U.S. Appl. No. 15/949,566, filed Apr. 10, 2018, Ivan-Christopher Robin, et al.
U.S. Appl. No. 16/159,923, filed Oct. 15, 2018, Louis Hutin, et al.
French Preliminary Search Report dated Jun. 27, 2018 in French Application 17 59789, filed Oct. 18, 2017 (with English Translation of Categories of Cited Documents).
Hutin, L., et al. "SOI CMOS Technology for Quantum Information Processing", 2017 IEEE International Conference on IC Design and Technology (ICICDT), IEEE, 2017, pp. 1-4.
Maurand, R., et al. "A CMOS silicon spin qubit", Nature Communications, vol. 7, 2016, 7 : 13575, pp. 1-6.
Veldhorst, M., et al. "A two-qubit logic gate in silicon", Nature, vol. 526, 2015, pp. 410-414.
De Franceschi, S., et al. "SOI technology for quantum information processing", Electron Devices Meeting (IEDM), 2016 IEEE International, pp. 13.4.1-13.4.4.

* cited by examiner

QUANTUM DEVICE WITH SPIN QUBITS COUPLED IN MODULATABLE MANNER

TECHNICAL FIELD AND PRIOR ART

The invention relates to the field of spintronics, and notably quantum information processing, or quantum computing. The invention notably relates to a quantum device with quantum bits or spin qubits, scalably coupled therebetween.

In order that a quantum device with spin qubits, also known as quantum boxes or "quantum dots", may fulfill quantum logic functions, it is necessary to:
- define a quantum system with two levels, or two states (binary system);
- be able to manipulate the quantum state of the qubits;
- be capable of detecting a change in the quantum states of the qubits;
- be able to cause the qubits to communicate with each other via an adjustable or scalable quantum coupling.

The document "SOI technology for quantum information processing" by S. De Franceschi et al., Electron Devices Meeting (IEDM), 2016 International IEEE, pp. 13.4.1-13.4.4, describes a quantum device produced with FDSOI technology in which two qubits connected in series with one another are implemented in an active area of an SOI substrate covered by two gates for controlling these two qubits. Source and drain regions implemented in the active area form charge carrier reservoirs for these two qubits. In such a device, the quantum coupling between the two qubits is not adjustable or scalable. These qubits cannot therefore communicate with each other and they can be used only in the form of a single qubit.

The document "A two-qubit logic gate in silicon" by M. Veldhorst et al., Nature 526, 410-414 (2015), provides for controlling the coupling between two qubits by superimposing, above the control gates of these qubits, additional gates arranged on a dielectric layer ensuring electrical isolation between the control gates and these additional gates. This configuration, however, creates a strong capacitive coupling between the superimposed gates.

DISCLOSURE OF THE INVENTION

There is therefore a need to provide a quantum device with spin qubits coupled therebetween such that this coupling is scalable, and not having the drawbacks of the prior art quantum devices disclosed above.

For this, a quantum device with at least two spin qubits is provided, comprising at least:
- one semiconductor portion arranged on a buried dielectric layer of a semiconductor-on-insulator type substrate further including a semiconductor support layer such that the buried dielectric layer is arranged between the semiconductor portion and the support layer, wherein at least two first distinct parts each form a confinement region of one of the two qubits and are spaced apart from one another by at least one second part forming a coupling region between the confinement regions of the two qubits;
- at least two front gates each at least partially covering one of the two first parts of the semiconductor portion;
- and wherein the support layer comprises at least one doped region at least one part of which is arranged in line with, or opposite, or under, the second part of the semiconductor portion and forms a back gate controlling the coupling between the confinement regions of the two qubits.

In this device, the coupling between the confinement regions of the qubits, i.e. the regions in each of which a charge is intended to be trapped by forming a potential well under one of the front gates, is adjustable thanks to a tunnel barrier formed by the coupling region (which corresponds to the second part of the semiconductor portion), the level of this tunnel barrier being adjustable according to the electrical potential applied to the doped region of the support layer which is located under this tunnel barrier and which acts by field effect (due to the buried dielectric layer present between this doped region and the coupling region) on the level of this tunnel barrier. The coupling region thus forms a barrier that can be lowered by the control back gate.

This device does not comprise any superimposition of gates generating a significant capacitive coupling therebetween since the front gates are not superimposed on the doped region of the support layer forming the back gate controlling the coupling between the confinement regions of the qubits. The capacitive coupling between the front gates and the back gate is very low compared to the case of gates superimposed and separated by a thin oxide.

The qubits are not similar to series-connected CMOS transistors since a CMOS transistor requires a charge carrier reservoir on each side of its channel. Two MOS transistors are connected in series with one another by necessarily connecting one of the drain and source regions of one of the two transistors to one of the drain and source regions of the other of the two transistors. In the quantum device, no charge carrier reservoir, formed by a heavily doped region, is present between the first parts of the semiconductor portion which form the confinement regions of the qubits.

Furthermore, in a CMOS transistor, a back gate is used to modulate the potential of the channel and is therefore located under, or in line with, the channel and may not be implemented in self-aligned manner with respect to the front gate of the transistor. In the quantum device, the doped region formed in the support layer is arranged at least partly under, or in line with, the second part of the semiconductor portion which corresponds to the coupling region between the qubits and not under, or in line with, one of the first parts of the semiconductor portion which correspond to the confinement regions of the qubits.

In addition, the doped region forming the back gate controlling the coupling between the confinement regions of the two qubits is self-aligned with respect to the front gates, and therefore also with respect to the second part of the semiconductor portion which forms the coupling region between the confinement regions of the two qubits. This configuration helps avoid the risk of misalignment between the front gates and the back gate, such misalignments being able to create parasitic capacitances between the front and back gates and an asymmetry in the coupling area between the qubits, affecting the performance of this coupling.

The support layer may comprise a plurality of doped regions forming a plurality of back gates controlling the coupling between the confinement regions of a plurality of qubits. In this case, the quantum device comprises more than two qubits coupled therebetween via different coupling regions each being scalable via one of the back gates. In this case, at least one part of each of the doped regions is arranged in line with one of the second parts of the semiconductor portion and self-aligned with respect to the front gates, and forms a back gate controlling the coupling between the confinement regions of two of the qubits.

In this case, each of the doped regions may comprise at least one contact area electrically connected to an individual electrical contact compatible with an individual addressing of the back gates. Thus, the couplings between the different qubits may be individually scaled.

A method for producing a quantum device with at least two spin qubits is also provided, comprising at least:

producing at least two front gates each at least partially covering one of two first distinct parts of a semiconductor portion arranged on a buried dielectric layer of a semiconductor-on-insulator type substrate which further includes a semiconductor support layer such that the buried dielectric layer is arranged between the semiconductor portion and the support layer, the two first parts each being intended to form a confinement region of one of the two qubits and are spaced apart from one another by at least one second part of the semiconductor portion intended to form a coupling region between the confinement regions of the two qubits;

doping at least one region of the support layer, at least one part of which is arranged in line with the second part of the semiconductor portion and is intended to form a back gate controlling the coupling between the confinement regions of the two qubits.

Such a quantum device may be produced with a technology derived from that of CMOS devices. For example, the doped region may be produced in the support layer via a local "ground plane" type of doping, through the buried dielectric layer after producing the front gates, or after producing the dummy gates which will be replaced later by the front gates, and before producing the spacers around the front gates or dummy gates.

The front gates are produced before doping the region of the support layer.

Doping the region of the support layer may comprise the implementation of the following steps:

producing a mask including at least one opening formed through the mask;

implanting dopants in said region of the support layer the pattern of which is defined by that of the opening passing through the mask and by that of the front gates or dummy gates.

The doped region of the support layer forming the control back gate is produced in self-aligned manner with respect to the front gates, and therefore self-aligned with respect to the second part of the semiconductor portion forming the coupling region of the qubits.

The method may further comprise, after the step of doping said region of the support layer, the steps of:

producing dielectric spacers surrounding each of the front gates or dummy gates and covering the second part of the semiconductor portion;

doping at least two third parts of the semiconductor portion between which the first and the second parts are arranged intended to form electrical charge carrier reservoirs.

An epitaxy may be implemented for forming the two third parts of the semiconductor portion.

BRIEF DESCRIPTION OF THE DRAWINGS

The present invention will be better understood on reading the description of embodiments given purely as a guide and in no way restrictive, and by referring to the appended drawings, in which:

FIGS. 2A to 8B show the steps of a method of producing a quantum device with scalably coupled spin qubits according to the first embodiment;

Identical, similar, or equivalent parts in the various figures described below bear the same numerical references in order to facilitate passing from one figure to another.

The various parts shown in the figures are not necessarily shown at the same scale, to make the figures more legible.

The various possibilities (variants and embodiments) must be understood as not being mutually exclusive, and may be combined with one another.

DETAILED DISCLOSURE OF PARTICULAR EMBODIMENTS

Figure 1A:
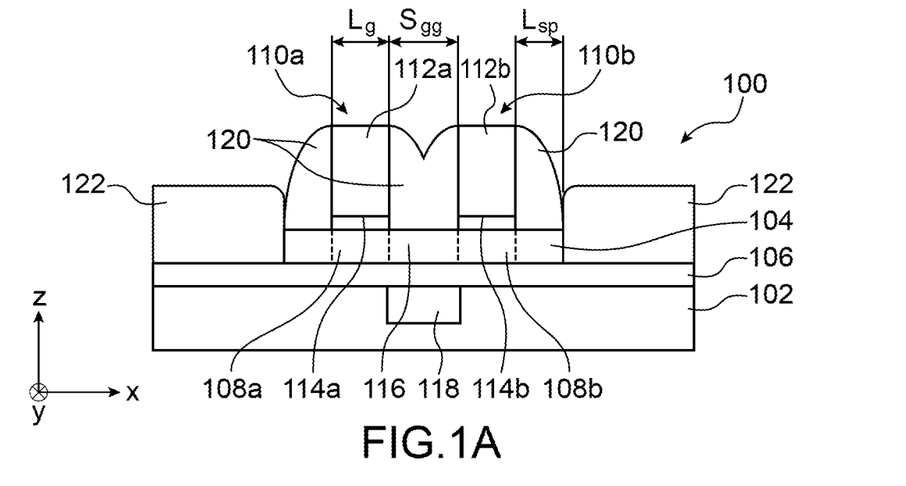
FIGS. 1A and 1B show a quantum device with scalably coupled spin qubits according to a first embodiment.
Figure 1B:
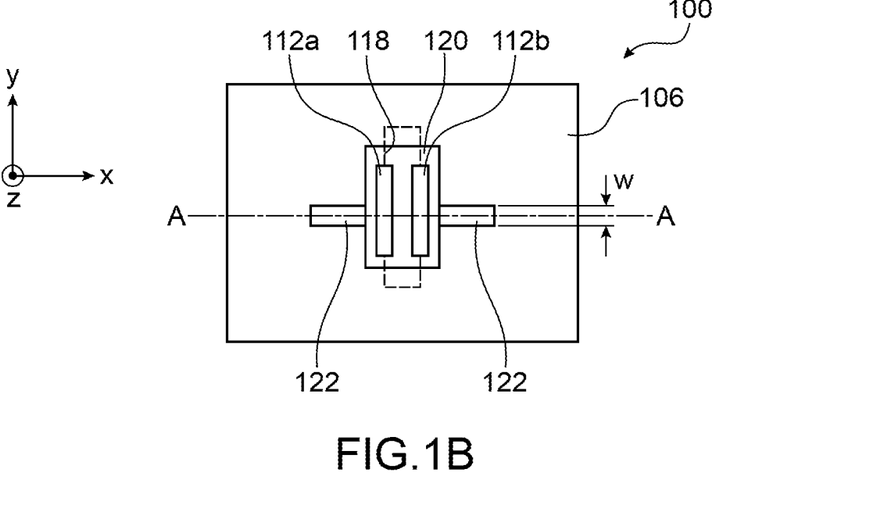

Reference is made first of all to FIGS. 1A and 1B which respectively show a sectional view and a top view of a quantum device 100 with scalably coupled spin qubits, according to a first embodiment. FIG. 1A is a sectional view along an axis AA visible in FIG. 1B.

The device 100 is produced in a semiconductor-on-insulator, e.g. SOI (silicon-on-insulator) type substrate. This substrate comprises a support layer 102, or bulk layer, of semiconductor including silicon, for example. The substrate also comprises a semiconductor surface layer (not visible in FIGS. 1A and 1B), including silicon, for example, from which a portion 104 of semiconductor is produced. A buried dielectric layer 106 is arranged between the support layer 102 and the semiconductor surface layer, and therefore between the support layer 102 and the portion 104. The buried dielectric layer comprises silicon oxide, for example. The thickness of the portion 104 (dimension along the Z axis in FIGS. 1A and 1B), and therefore also the thickness of the semiconductor surface layer from which the portion 104 is produced, is, for example, between approximately 6 nm and 20 nm. The thickness of the buried dielectric layer 106 is, for example, between approximately 20 nm and 145 nm. The thickness of the support layer 102 is, for example, equal to several hundred microns.

In the first embodiment described here, the device 100 comprises two spin qubits. Each of the qubits includes a confinement region formed by a first part of the portion 104. In FIG. 1A, two first parts of the portion 104 are referenced 108a and 108b and each belong to one of the two qubits of the device 100. In FIG. 1A, these two first parts 108a, 108b are delimited symbolically (due to the fact that the nature of the semiconductor of the first parts 108a, 108b is similar to that of the rest of the semiconductor of the portion 104) by dotted lines. Each of the qubits also includes a front gate, referenced 110a and 110b in FIG. 1A. Each of the front gates 110a, 110b comprises a conductive portion 112a, 112b and a gate dielectric 114a, 114b interposed between the conductive portion 112a, 112b and the first part 108a, 108b of the portion 104.

The two qubits of the device 100 are connected in series with one another via a second part 116 of the portion 104, forming a coupling region between the confinement regions (the first parts 108a, 108b) of the two qubits. Like the semiconductor of the first parts 108a, 108b, the semiconductor of the second part 116 is non-intentionally doped. Only a residual doping is present in the first and second parts 108a, 108b, 116 of the portion 104 and is, for example, less than or equal to approximately $10^{16}$ at·cm$^{-3}$.

The quantum coupling between the confinement regions 108a, 108b created by the second part 116, or more particularly the level of the tunnel barrier formed by the second part 116 between the confinement regions 108a, 108b is scalable thanks to a doped region 118 of the support layer 102. A part of this region 118 is arranged in line with, or opposite, or under, the second part 116 of the portion 104. Thus, the projection of this part of the region 118 in a plane parallel to the plane (X,Y) or parallel to the interface between the support layer 102 and the buried dielectric layer 106, is superimposed on the projection of the second part 116 of the portion 104 in this same plane.

Furthermore, the region 118 is here self-aligned with respect to the front gates 110a, 110b. Thus, by projecting the region 118 and the front gates 110a, 110b in a same plane parallel to the plane (X,Y), the edges of a part of the region 118 thus projected are aligned with those of the projection of the front gates 110a, 110b in this plane. In addition, the part of the region 118 which is arranged in line with the second part 116 of the portion 104 is also self-aligned with this second part 116.

The region 118 advantageously corresponds to a locally doped region of the semiconductor of the support layer 102. The doping carried out for forming the region 118 is significant and advantageously greater than approximately $10^{19}$ at·cm$^{-3}$, and this in order to avoid freezing the low temperature charge carriers. The doping level of the region 118 is sufficiently large for the charge time (duration RC) to be low compared to the characteristic measurement time. Indeed, considering that at zero order a manipulation on the back gate (reading of charge or exchange of charge) must be shorter than the time after which a spin loses its coherence, the charge time is chosen to be short, e.g. of the order of approximately 1 ns, compared to the characteristic measurement time which is, for example, of the order of 100 ns. The dopants implanted in the semiconductor of the region 118 may be n or p type. Doping of the region 118 is such that this region 118 is conductive, the polarity of the implanted impurities being able to be compensated by the voltage applied to the region 118.

In general, the region 118 corresponds to an electrically conductive doped region formed within the support layer 102, close to the interface between the support layer 102 and the buried dielectric layer 106 so that it is near the second part 116 of the portion 104.

In the device 100, the region 118 is created locally, self-aligned with respect to the various parts 108a, 108b, 116 of the portion 104 and the front gates 110a, 110b, and therefore targeted with respect to the tunnel barrier the transparency, or level, of which is intended to be scaled.

Each of the front gates 110a, 110b is surrounded by a dielectric spacer 120 which therefore rests on the portion 104 and on the buried dielectric layer 106. Finally, doped third parts 122 of the portion 104 between which the first and second parts 108a, 108b, 116 of the portion 104 are arranged, form charge carrier reservoirs for the qubits of the device 100.

In this device 100, depending on the type of qubits formed (singlet triplet, single electron), the manipulation (singlet triplet) or reading control in each qubit may be implemented via the front gates 110a, 110b. By contrast, the communication between these two qubits is ensured via the coupling region formed by the second part 116 of the portion 104 and controlled by the region 118, which forms a back gate for controlling this quantum coupling between the confinement regions of the qubits. This back gate makes it possible to adjust the degree of coupling between the two quantum boxes formed by the first parts 108a, 108b of the portion 104, through adjusting the tunnel barrier that separates them (tunnel barrier formed by the second part 116 of the portion 104). Depending on the polarity applied to the region 118, this tunnel barrier may be reduced (strong coupling) or increased (weak coupling, high confinement), with a minimal coupling with respect to other tunnel junctions or front gates of the qubits.

By way of example, the gate length Lg of each of the front gates 110a, 110b, which also corresponds to the length of each of the first parts 108a, 108b of the portion 104, is between approximately 10 nm and 60 nm. This gate length Lg corresponds to the dimension parallel to the largest dimension of the portion 104, or parallel to the direction of displacement of the charge carriers within the portion 104 (dimension parallel to the X axis in FIGS. 1A and 1B).

The width W of the portion 104, i.e. the width of the first and second parts 108a, 108b, 116 of the portion 104, is, for example, between approximately 5 nm and 80 nm. This width W corresponds to that which is perpendicular to the dimension Lg and to the thickness of the portion 104. In FIGS. 1A and 1B, this width W of the portion 104 is parallel to the Y axis shown in FIGS. 1A and 1B.

The inter-gate space Sgg, which corresponds to the spacing between two neighboring front gates 110a, 110b and which is also equal to the length of the second part 116, is, for example, between approximately 20 nm and 90 nm. This inter-gate space is parallel to the gate length Lg of each of the front gates 110a, 110b, and therefore, parallel to the X axis shown in FIGS. 1A and 1B.

The length $L_{SP}$ of each of the spacers 120, which corresponds to the dimension of each of the spacers 120 which is parallel to the gate length Lg of the front gates 110a, 110b and to the inter-gate space Sgg, is, for example, greater than half of the inter-gate space Sgg and, for example, greater than approximately 20 nm.

Although not visible in FIGS. 1A and 1B, the device 100 comprises electrical contacts for applying and/or reading the electrical potentials on the various qubit elements. Thus, electrical contacts may be connected to each of the front gates 110a, 110b in order to be able to apply a control electrical potential to each of these front gates 110a, 110b. Other electrical contacts connected to the third parts 122 of the portion 104 may be used for reading and writing in the qubits. Another electrical contact may be connected to the region 118, e.g. at a contact area of the region 118, which is not arranged in line with the second part 116 of the portion 104, nor in line with the spacers 120 in order that this contact area is accessible from the front face of the device 100 by passing through the buried dielectric layer 106.

A method of producing the device 100 according to the first embodiment is described below in connection with FIGS. 2A to 8B. FIGS. 2B, 3B, . . . , 8B show top views of the structure obtained through the steps implemented, and FIGS. 2A, 3A, . . . , 8A show sectional views, along the axis AA of this structure visible in FIG. 2B.

Figure 2A:
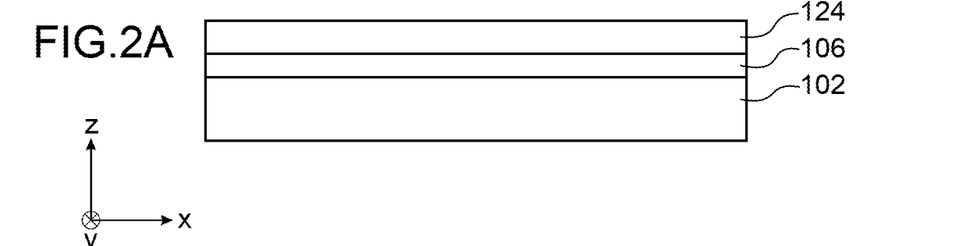
Figure 2B:
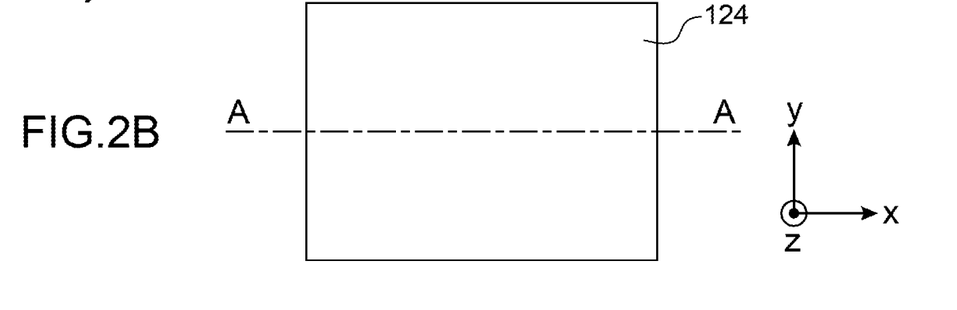

As shown in FIGS. 2A and 2B, the method is implemented from the SOI substrate previously described in connection with FIGS. 1A and 1B, i.e. including the support layer 102, the buried dielectric layer 106, and the semiconductor surface layer, referenced here 124, from which the portion 104 is intended to be produced.

The surface layer 124 is then etched in order to form the portion 104 in which the qubits of the device 100 will be produced.

Figure 3A:
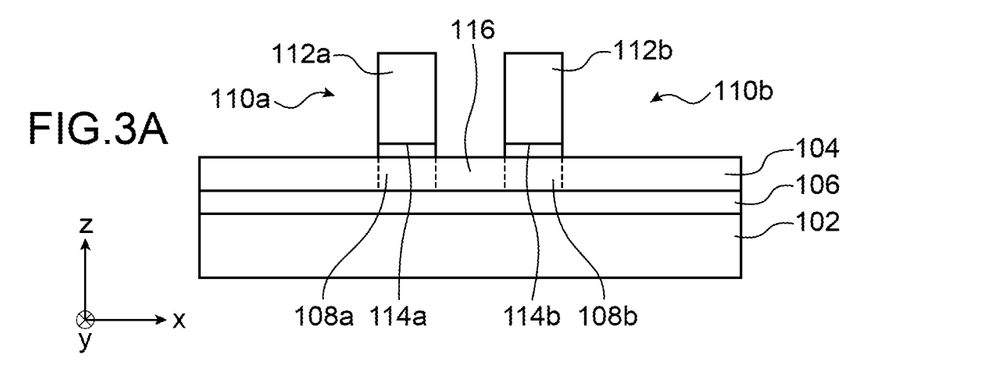
Figure 3B:
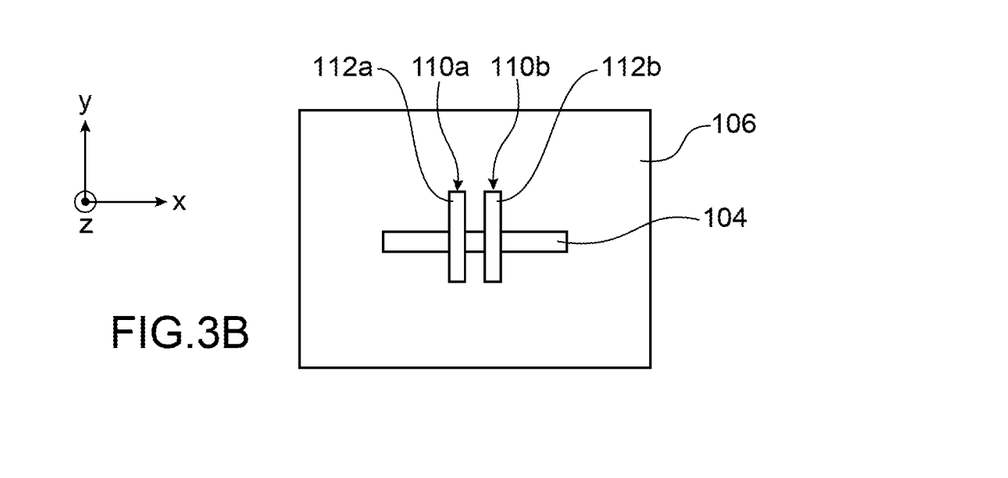
Figure 4A:
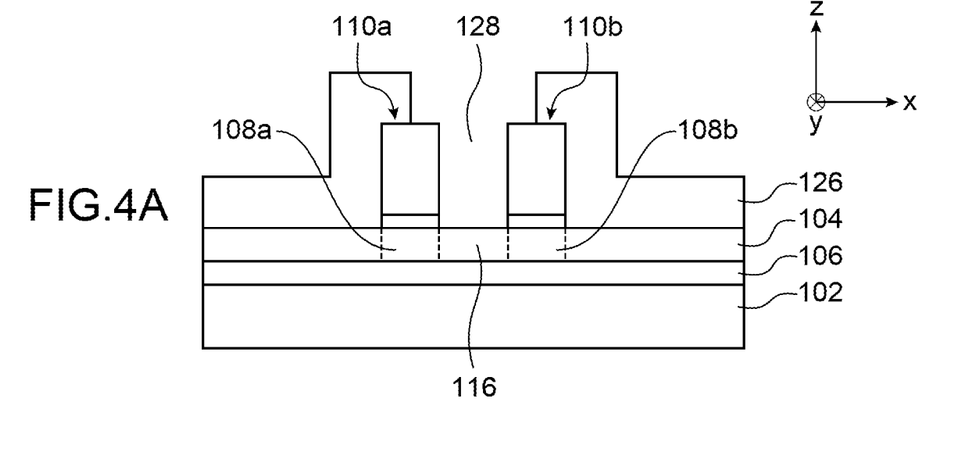

In FIGS. 3A, 4A, etc., only a part of the device 100 is shown, this part of the device 100 corresponding to that including the portion 104. The parts of the device 100 where the semiconductor surface layer 124 has been eliminated are not visible in these figures.

The front gates 110a, 110b are then produced. These front gates 110a, 110b extend in a direction (parallel to the Y axis in the example described here) substantially perpendicular to that along which the portion 104 extends (parallel to the X axis in the example described here). In other words, each of the front gates 110a, 110b comprises a main dimension substantially perpendicular to that of the portion 104. The parts of the portion 104 covered by the central parts of the front gates 110a, 110b correspond to the first parts 108a, 108b intended to form the confinement regions of the qubits. The first parts 108a, 108b of the portion 104 are separated from one another by the second part 116. These front gates 110a, 110b extend, perpendicular to the main axis of the portion 104, over parts of the buried dielectric layer 106 revealed by the previous etching of the surface layer 124 (FIGS. 3A and 3B). These front gates 110a, 110b are produced by deposits of a dielectric gate material then of a gate conductive material, then by an etching of these layers to form the gate dielectrics 114a, 114b and the gate conductive portions 112a, 112b. The shaping of these elements from the deposited materials may be performed by electron beam lithography, or else by hybrid deep UV/electron beam lithography, or by a plurality of deep UV lithographic steps.

Figure 4B:
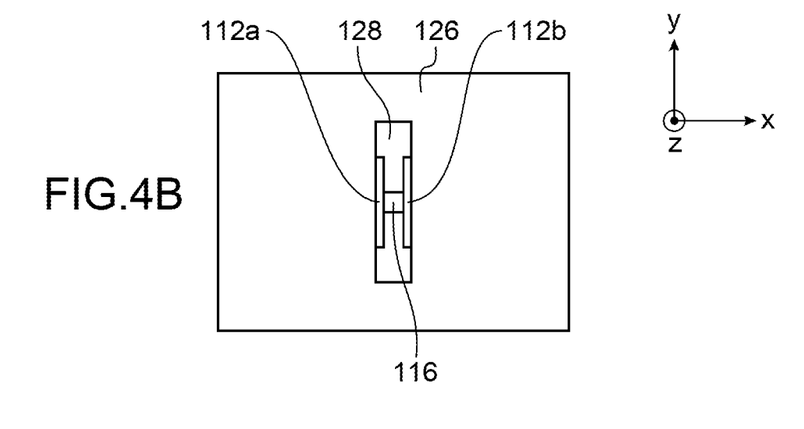

As shown in FIGS. 4A and 4B, a mask 126 is then created on the previously formed structure, in order to delimit, with the front gates 110a, 110b, the region 118 of the support layer 102 intended to receive the implanted dopants. An opening 128 formed through the mask 126 delimits this region 118, with the front gates 110a, 110b. In the example of FIGS. 4A and 4B, the mask 126 is formed by partially covering the front gates 110a, 110b in order to have the edges of the front gates 110a, 110b arranged facing one another which are not covered by the mask 126 and allow the self-alignment of the region 118 with respect to these edges. The mask 126 corresponds, for example, to a hard mask including a semiconductor oxide or a photosensitive resin. The thickness of the mask 126 is chosen according to the material used and such that the dopants implanted later do not pass through this mask 126.

Figure 5A:
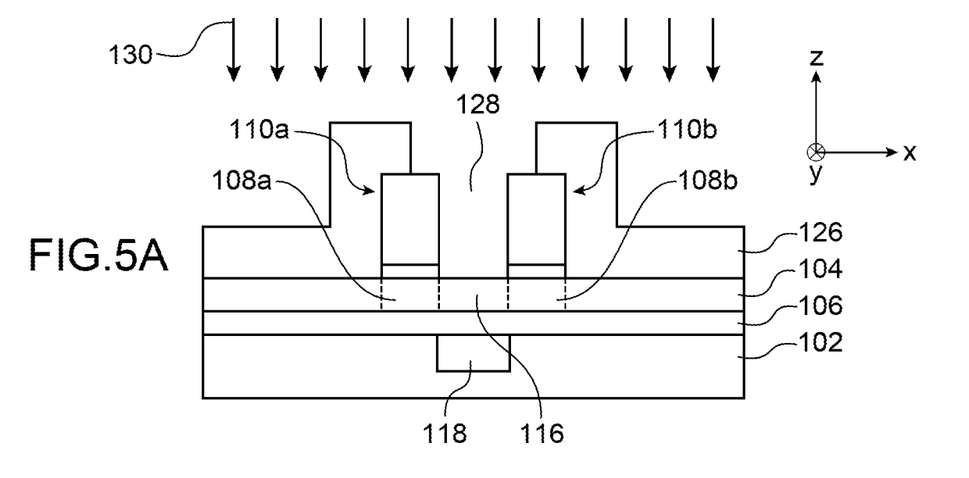
Figure 5B:
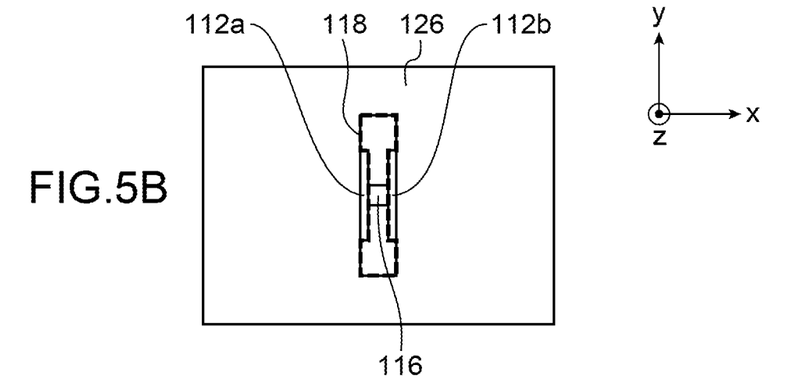

In FIGS. 5A and 5B, an ion implantation is then implemented in order to form the region 118 in the support layer 102. In FIG. 5A, the ion beams performing the doping are represented symbolically by arrows referenced 130. The masking performed by the mask 126 and the front gates 110a, 110b prevents the implantation of the dopants under this masking. In FIG. 5B, the region 118 is represented by a dotted line.

The dose and the energy of the ion beams used for this implementation are adjusted in order not to make the semiconductor of the portion 104 amorphous and not to implant dopants, or very little dopant, in the portion 104. The level of doping tolerated is such that it is unlikely to find a dopant in the second part 116. For example, if this second part 116 has dimensions of 20 nm*80 nm*90 nm, the maximum concentration of dopants tolerated in this second part 116 is approximately $7.10^{15}$ at·cm$^{-3}$. These implantation parameters are chosen such that the distribution of implanted dopants is maximum in the semiconductor of the support layer 102 located on the side of the rear interface of the buried dielectric layer 106, then forming the region 118, which, because of the level of doping obtained, has an electrical conductivity corresponding to that of an electrically conductive material. The implemented ion implantation is such that the concentration of dopants in the semiconductor of the portion 104 remains lower than or equal to approximately $1.10^{16}$ at·cm$^{-3}$, and that the concentration of dopants in the semiconductor of the region 118 is greater than or equal to approximately $1.10^{19}$ at·cm$^{-3}$. For example, when the thickness of the buried dielectric layer 106 is equal to approximately 145 nm, ion implantation may be performed with a dose between approximately $1.10^{13}$ at·cm$^{-2}$ and $5.10^{13}$ at·cm$^{-2}$ and an energy between approximately 250 keV and 300 keV.

Figure 6A:
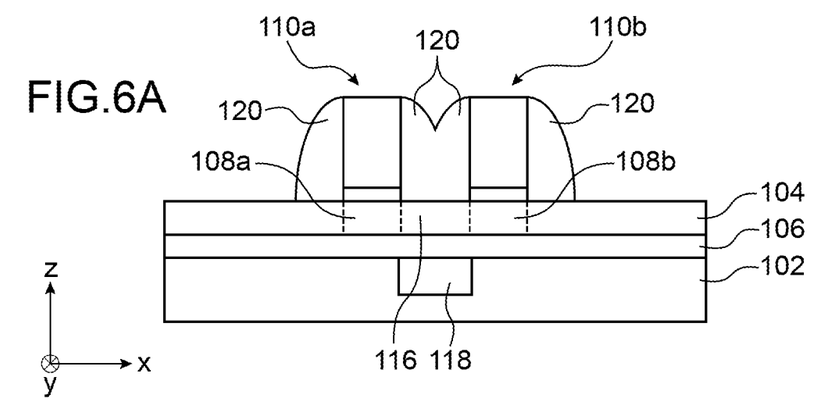
Figure 6B:
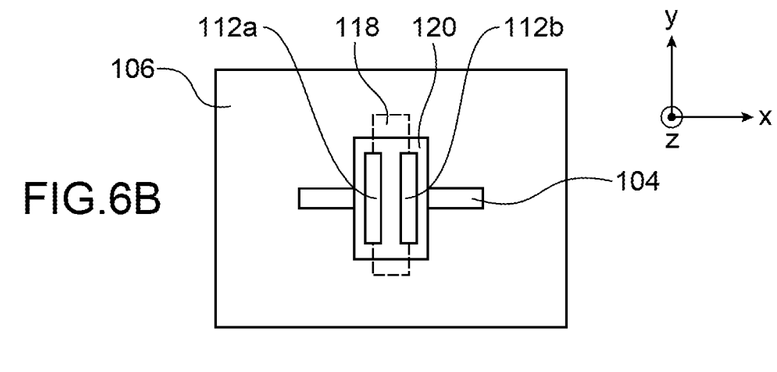

The mask 126 is then removed, then the spacers 120 are created around the front gates 110a, 110b (FIGS. 6A and 6B). The length $L_{SP}$ of each spacer 120 is such that the second part 116 of the portion 104 is covered by these spacers 120 and that the distance between the first parts 108 of the portion 104 and the third parts 122 intended to form the charge carrier reservoirs is greater than or equal to approximately 20 nm. These spacers 120 are produced in a similar way to gate spacers of a MOSFET device.

Figure 7A:
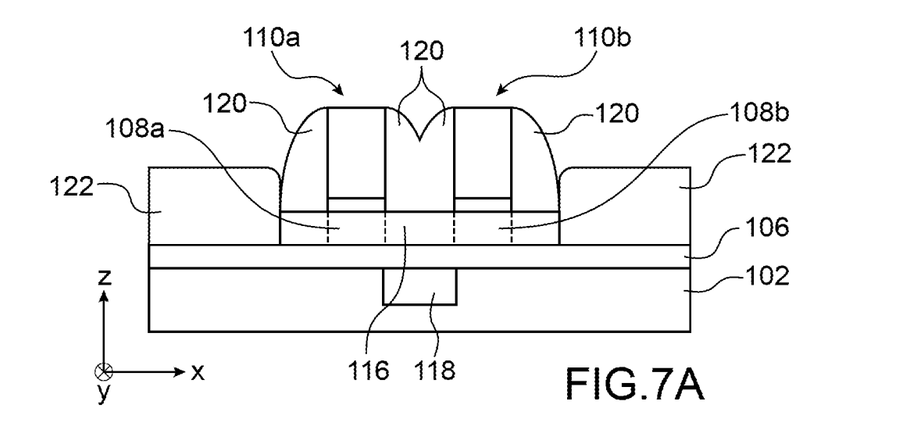
Figure 7B:
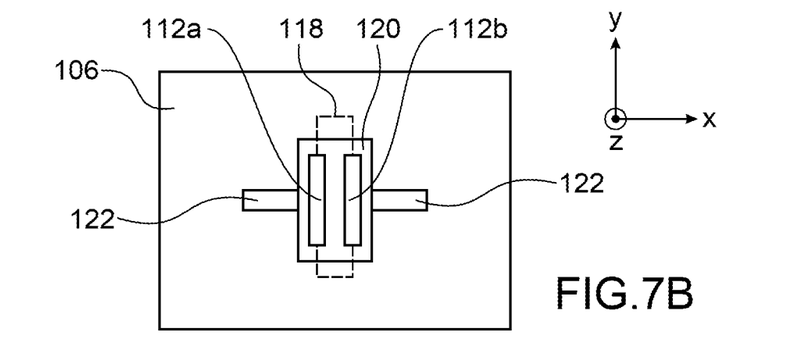

The charge carrier reservoirs are then created, e.g. by epitaxy on the semiconductor parts of the portion 104 which are not covered by the front gates 110a, 110b and the spacers 120, then by doping (in situ doping or ion implantation), forming the third parts 122 (FIGS. 7A and 7B). As a variant, it is possible for the third parts 122 to be obtained without using epitaxy. The parameters of the ion implantation that may perform the doping of the semiconductor of the third parts 122 of the portion 104 are such that the dopants are only implanted in this semiconductor and not in the support layer 102, which parameters may correspond to a dose between approximately $5.10^{14}$ at·cm$^{-2}$ and $5.10^{15}$ at·cm$^{-2}$ and an energy lower than approximately 10 keV.

Figure 8A:
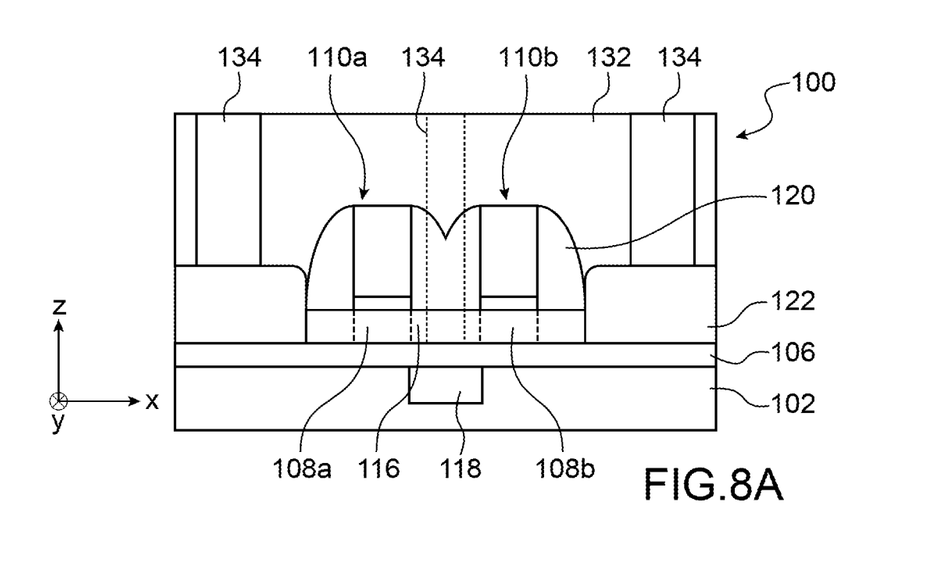
Figure 8B:
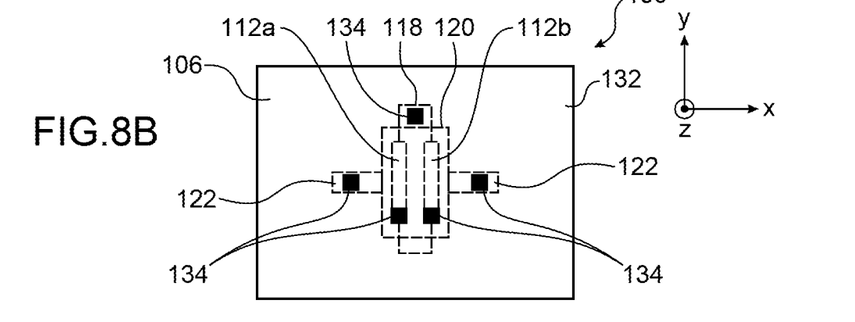

As shown in FIGS. 8A and 8B, the structure obtained is then encapsulated via the deposit of an encapsulation layer 132 covering all the previously created elements. Electrical contacts 134 are then made in order to form electrical accesses to the third parts 122, to the front gates 110a, 110b and to the region 118. The electrical contact 134 connected to the region 118 (shown with dotted line in FIG. 8A) is formed next to the spacers 120 and passes through the encapsulation layer 132 and the buried dielectric layer 106. Siliconizing of the electrical contacts may also be implemented at this stage of the method.

Figure 9:
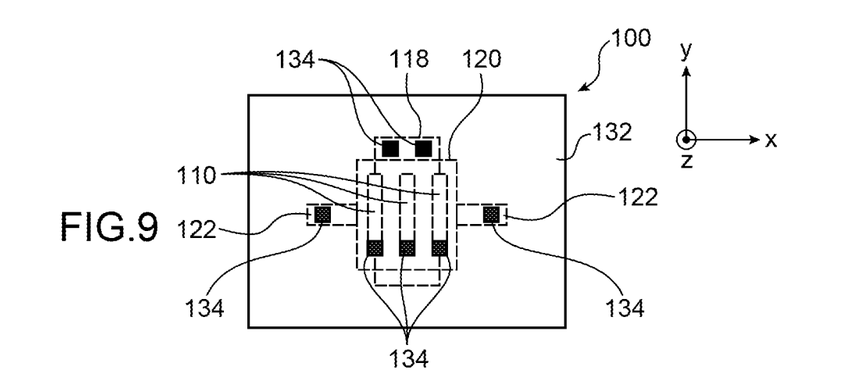
FIGS. 9 to 11 show variant embodiments of the quantum device with scalably coupled spin qubits.

In the first embodiment described above, two confinement regions of two qubits are coupled in series with one another via the second part 116 of the portion 104 located between these two confinement regions, the doped region 118 forming a back gate making it possible to control this coupling. As a variant, it is possible for the device 100 to comprise a greater number of qubits coupled with one another in twos. In this case, a plurality of front gates 110 are created next to each other, each notably covering a first part 108 of the portion 104 forming a confinement region of one of the qubits. FIG. 9 corresponds to a top view of the device 100 according to such a variant. The region 118 thus created, according to the previously described method, then makes it possible to scale the coupling for all the second parts forming the coupling portions between the confinement regions of the qubits.

Figure 10:
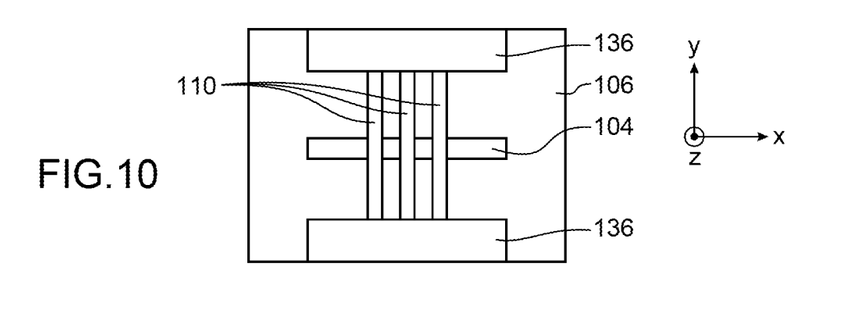
Figure 11:
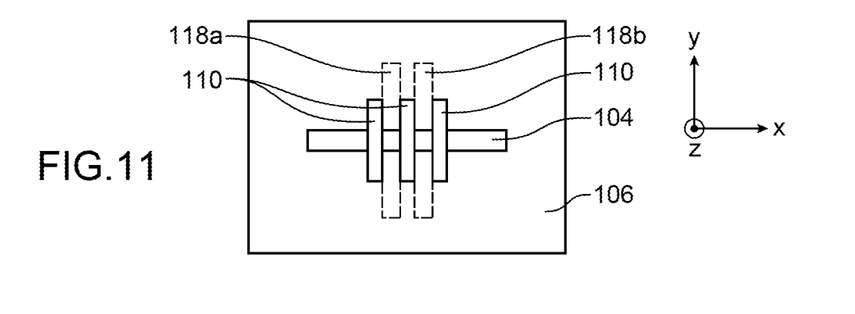

When the device 100 comprises more than two qubits coupled with one another, it is, however, advantageous to produce this device 100 such that the coupling made by each second part 116 is scalable independently of one another via a plurality of independent, or distinct, regions 118, each associated with one of the second parts 116. These various regions 118 are in this case not in contact with one another. For this, during the ion implantation of dopants in the support layer 102 for forming these regions 118, it is possible to carry out a preliminary additional masking at the ends of the front gates in order that the parts of the support layer 102 receiving these dopants only correspond to those located between the parts of the layer 102 arranged under the front gates 110 (see FIG. 10 in which additional masks 136 cover the parts of the structure at the ends of the front gates 110). The implantation then implemented forms as many regions 118 as second parts 116. These various regions 118 may be controlled independently of one another thanks to the various electrical contacts 134 then made and connected to each of them. For making the electrical contacts 134 connected to the regions 118, a preliminary etching of the ends of the front gates 110 is advantageous, as shown in FIG. 11, in order to free access to the contact areas of the regions 118 thus created. In FIG. 11, the device 100 comprises three qubits the confinement regions of which are coupled in twos via two second parts 116. Two doped regions 118a, 118b independent of one another are thus produced, each making it possible to control the coupling of the second part 116 of the portion 104 which is arranged above this region 118.

In the previously described embodiments, the front gates 110 are created on the portion 104 prior to production of the doped region 118. As a variant, it is possible for the front gates 110 to be created after the region 118. However, in order that the region 118 is properly created in a self-aligned manner with respect to these front gates 110, "dummy gates" may in this case be created prior to producing the region 118, at the locations provided for the front gates 110. The doped region or regions 118 are then created in a self-aligned manner with respect to these dummy gates. The spacers 120 are then created then these dummy gates are eliminated and replaced by the definitive front gates 110.

The invention claimed is:

1. A method for producing a quantum device with at least two spin qubits, the method comprising:
   producing at least two front gates each at least partially covering one of two first distinct parts of a semiconductor portion arranged on a buried dielectric layer of a semiconductor-on-insulator type substrate which further comprises a semiconductor support layer such that the buried dielectric layer k arranged between the semiconductor portion and the support layer, the two first parts each forming a confinement region of one of the two qubits and are spaced apart from one another by at least one second part of the semiconductor portion forming a coupling region between the confinement regions of the two qubits, then after the producing,
   doping at least one region of the support layer, which is arranged in line with the second part of the semiconductor portion and is self-aligned with respect to the front gates, thereby forming a back gate controlling coupling between the confinement regions of the two qubits,
   wherein the confinement regions of the two qubits correspond to regions in each of which a charge is trapped by forming a potential well under one of the at least two front gates, and
   wherein the at least two front gates are not overlapping with the doped region of the supporting layer forming the back gate.

2. The method according to claim 1, wherein the doping comprises:
   producing a mask including at least one opening formed through the mask;
   implanting dopants in said region of the support layer wherein the pattern of which is defined by that of the opening passing through the mask and by that of the at least two front gates.

3. The method according to claim 1, further comprising:
   before the producing, etching a semiconductor surface layer of the substrate, at least one remaining portion of the surface layer forming the semiconductor portion.

4. The method according to claim 1, further comprising:
   after the doping,
   producing dielectric spacers surrounding each of the at least two front gates and covering the second part of the semiconductor portion;
   doping at least two third parts of the semiconductor portion between which the first and the second parts are arranged, thereby forming electrical charge carrier reservoirs.

5. The method according to claim 1, wherein the doping comprises forming a plurality of doped regions of the support layer to form a plurality of back gates controlling the coupling between the confinement regions of a plurality of qubits.

6. The method according to claim 5, further comprising:
   producing a plurality of individual electrical contacts each electrically connected to a contact area of one of the doped regions of the support layer and compatible with an individual addressing of the back gates.

7. The method according to claim 1, wherein the coupling between the confinement regions of the two qubits is adjustable with a tunnel barrier formed by the coupling region, a level of the tunnel barrier being adjustable according to an electrical potential applied to the doped region of the support layer which is located under this tunnel barrier and which acts by field effect on the level of the tunnel barrier.

8. The method of claim 1, wherein the quantum device is a quantum planar device in which a conducting channel of the semiconductor is formed under the at least two front gates.

9. The method of claim 1, wherein the doping is doping only a part of the support layer, which is arranged in line with the second part of the semiconductor portion and is self-aligned with respect to the front gates, and is intended to form a back gate controlling the coupling between the confinement regions of the two qubits.

10. A method for producing a quantum device with at least two spin qubits, the method comprising, in the following order,
   producing at least two dummy gates, each at least partially covering one of two first distinct parts of a semiconductor portion arranged on a buried dielectric layer of a semiconductor-on-insulator type substrate which further comprises a semiconductor support layer such that the buried dielectric layer is arranged between the semiconductor portion and the support layer, the two first parts each forming a confinement region of one of the two qubits and are spaced apart from one another by at least one second part of the semiconductor portion forming a coupling region between the confinement regions of the two qubits, then,
   doping at least one region of the support layer, which is arranged in line with the second part of the semiconductor portion and is self-aligned with respect to the at least two dummy gates, thereby forming a back gate controlling the coupling between the confinement regions of the two qubits,
   eliminating the at least two dummy gates, and producing the at least two front gates at locations corresponding to those occupied by the at least two dummy gates, wherein the confinement regions of the two qubits correspond to regions in each of which a charge is trapped by forming a potential we under one of the at least two front gates, and wherein the at least two front gates are not overlapping with the doped region of the supporting layer forming the back gate.

11. The method according to claim 10, wherein the doping comprises:

producing a mask including at least one opening formed through the mask;

implanting dopants in said region of the support layer wherein the pattern of which is defined by that of the opening passing through the mask and by that of the at least two dummy gates.

12. The method according to claim 10, further comprising, before the producing the at least two dummy gates, etching a semiconductor surface layer of the substrate, at least one remaining portion of the surface layer forming the semiconductor portion.

13. The method according to claim 10, further comprising, after the doping said region of the support layer:

producing dielectric spacers surrounding each of the at least two dummy gates and covering the second part of the semiconductor portion; and doping at least two third parts of the semiconductor portion between which the first and the second parts are arranged, thereby forming electrical charge carrier reservoirs.

14. A method for producing a quantum device with at least two spin qubits, the method comprising at least:

producing at least two front gates each at least partially covering one of two first distinct parts of a semiconductor portion arranged on a buried dielectric layer of a semiconductor-on-insulator type substrate which further comprises a semiconductor support layer such that the buried dielectric layer is arranged between the semiconductor portion and the support layer, the two first parts each forming a confinement region of one of the two qubits and are spaced apart from one another by at least one second part of the semiconductor portion forming a coupling region between the confinement regions of the two qubits, then after the producing, doping at least one region of the support layer, which is arranged in line with the second part of the semiconductor portion and is self-aligned with respect to the front gates, thereby forming a back gate controlling coupling between the confinement regions of the two qubits, wherein no charge carrier reservoir, formed by a heavily doped region, is present between the two first parts of the semiconductor portion which form the confinement regions of the two qubits, and wherein the at least two front gates are not overlapping with the doped region of the supporting layer forming the back gate.

* * * * *